United States Patent [19]

Azuma et al.

[11] Patent Number: 5,286,330
[45] Date of Patent: Feb. 15, 1994

[54] METHOD OF PRODUCING COPPER-CLAD LAMINATED BOARD

[75] Inventors: Keiji Azuma; Kimikazu Katoh, both of Tokyo; Ryoichi Oguro, Imaichi, all of Japan

[73] Assignees: Sumitomo Bakelite Company Limited; Circuit Foil Japan Co., Ltd., both of Tokyo, Japan

[21] Appl. No.: 877,833

[22] Filed: May 1, 1992

[30] Foreign Application Priority Data

May 13, 1991 [JP] Japan ................................. 3-201525

[51] Int. Cl.$^5$ ................................................. B65C 9/25
[52] U.S. Cl. ...................................... 156/323; 29/829; 100/211; 100/295; 156/153; 156/307.4; 174/259
[58] Field of Search ...................... 156/323, 153, 307.4; 29/829; 100/211, 295; 174/259

[56] References Cited

U.S. PATENT DOCUMENTS 3,677,876  7/1972  Oliver ................................. 156/323

FOREIGN PATENT DOCUMENTS 50-60772   5/1975  Japan .
62-214939  9/1987  Japan .
62-274795 11/1987  Japan .

Primary Examiner—John J. Gallagher
Attorney, Agent, or Firm—Frishauf, Holtz, Goodman & Woodward

[57] ABSTRACT

A method for preparing a copper-clad laminated board for a printed circuit board which comprises: (a) preparing a prepreg by permeating a thermosetting resin into a fabric and then drying the resulting material to a half-hardened state, (b) laminating a both-side roughened copper foil on both sides or one side of the prepreg or a plurality of prepregs bonded together, (c) placing the resulting laminate from step (b) between both press plates of a press machine, (d) placing a polyamide film having a melting point equal to or higher than 170° C. between the exposed side of the both-side roughened copper foil of the laminate and a press plate, (e) pressing the laminate with the press plates of the press machine at a temperature of 170° C. or higher, a pressure of 10 kgf/cm$^2$ or higher for a time of 60 minutes or longer, (f) separating the laminate from the press machine and (g) peeling the polyamide film from the laminate to obtain the copper-clad laminated board. The copper-clad laminated board can be used for a printed circuit board.

13 Claims, No Drawings

METHOD OF PRODUCING COPPER-CLAD LAMINATED BOARD

BACKGROUND OF THE INVENTION

The present invention relates to a method of producing a copper-clad laminated board for a printed circuit board, which uses a mold releasing film, such as a polyamide-type film.

Methods of producing a copper-clad laminated board (hereinafter abbreviated as "CCLB") for a multi-layered printed circuit board (hereinafter abbreviated as "MLPCB") include press molding of a both-side roughened copper foil (hereinafter abbreviated as "BSRCF") placed on a single prepreg therewith, and press molding of BSRCFs placed on both sides of a lamination of multiple prepregs therewith. The roughening of a copper foil is performed to improve the bonding between the copper foil and the prepreg.

However, a BSRCF has a shortcoming that when it is pressed with a prepreg, the fine ruggedness on the roughened surface of the copper foil, which is pressed with a press plate, is likely to be crushed.

To prevent the crushing of the ruggedness on the surface of the BSRCF, a metal film such as a copper foil or aluminum foil, or a conventionally used organic film such as polypropylene, polyethylene terephthalate, polyethylene, triphenylpentene or TEDRA (trade name of a resin film made by Du Pont) is placed between a press plate and a BSRCF at the time of press molding.

Hereupon, prepregs were acquired by permeating a thermosetting resin, such as phenolic resin, an epoxy resin, a polyimide resin, an epoxy modified polyimide resin or a cyanate ester resin, in a fabric or nonwoven fabric of a glass fiber, an aramid fiber, a polyester fiber, a carbon fiber, or paper, and drying the resultant structure.

However, when a metal foil is used, when there is a resin powder or the like remaining on the press plate, the metal foil stick on the press plate at that remaining portion and remains as foreign matter on the press plate, producing so-called stamping marks. Besides, when the aforementioned plastic film is used, it does not have the desirable property of separation from the press plate. Also, even when the plastic film is peeled off from the BSRCF, printing of that film surface on the surface of the BSRCF would be seen on the electron microscopic level due to cleavage fracture of the film used. This printing will have a bad effect upon the subsequent process of the molded CCLB.

SUMMARY OF THE INVENTION

It is therefore an object of the present invention to provide a method of producing a copper-clad laminated board for a printed circuit board, which can maintain the ruggedness on the roughened surface of a BSRCF, which is opposite to the surface contacting with a prepreg, keeps the roughened surfaces from being stained, and is easily separable from a press plane.

According to the present invention, in a step of yielding a CCLB for a printed circuit board by laminating a BSRCF on both sides or one side of a single prepreg or bonded plural prepregs, said prepreg acquired by permeating a thermosetting resin in a fabric or nonwoven fabric and drying the resultant structure to a hard-hardened state, and placing the resultant structure between press plates of a press machine; a method of producing a CCLB for a printed circuit board comprises a step to press-mold the CCLB with a polyamide-type film having a melting point equal to or higher than a lamination temperature placed between the BSRCF and the press plates. Generally the lamination temperature is 170° C. or higher.

Polyamide-type films to be used in this invention include nylon 6 expressed by a chemical formula of $(-NH(CH_2)_5CO-)_n$ or nylon 66 expressed by a chemical formula of $(-NH(CH_2)_6NHCO(CH_2)_4CO-)_n$, which can be formed into a film industrially. The polyamide-type film has only to have a melting point equal to or higher than a lamination temperature, and preferably has a thickness of 10 to 100 $\mu$m for easier handling, although not particularly limited thereto.

The measurement of the melting point of the polyamide is conducted by ASTMD 2117-64.

The press molding of CCLB is usually carried out under conditions of a heating temperature of 170° C. or higher, a pressure of 10 kgf/cm² or higher and a time of 60 minutes or longer. Accordingly, the melting point of a polyamide-type film is preferably 170° C. or higher in order to prevent adhesion of a portion of the film to the rugged portion on the surface of the BSRCF or to the press plate.

Even when the conventional type films other than a polyamide-type film have a melting point of 170° C. or higher, a portion of the films sticks on the ruggedness of the BSRCF or is fused on the press plate, possibly for the following reason. These films are inferior to a polyamide-type film in cleavage, impact resistance, fracture resistance.

A prepreg to be used in this invention is acquired by permeating a thermosetting resin, such as a phenolic resin, an epoxy resin, a polyimide resin, an epoxy modified polyimide resin or a cyanate ester resin, in a fabric or nonwoven fabric of a glass fiber, an aramid fiber, a polyester fiber, a carbon fiber, or paper, and drying the resultant structure in a half hardened state.

DETAILED DESCRIPTION OF THE PREFERRED EMBODIMENTS

Embodiments of the present invention will be more specifically described below.

EXAMPLE 1

With four glass epoxy prepregs EI-6765 (products of Sumitomo Bakelite, 180 $\mu$m in thickness and a resin content of 45%) placed between BSRCFS, STD foils (products of Circuit Foil Japan), 70 $\mu$m in thickness, the upper and lower copper foils were sandwiched by nylon 6 films (melting point of 220° C. and thickness of 20 $\mu$m) as a polyamide-type film, and the top and bottom portions of the resultant structure were held with press plates and were press-molded at a heated temperature of 170° C. for 180 minutes. After the press molding, the product was separated from the press plates, and the peeling characteristic of the film from the copper foil and the easiness of separation of the film from the press plate were evaluated.

EXAMPLE 2

Example 2 was produced in the same manner as Example 1 except for the use of nylon 66 film (melting point of 230° C. and thickness of 25 $\mu$m) as a polyamide-based film, and the same evaluation as made for Example 1 was also conducted.

COMPARATIVE EXAMPLE 1

Comparative Example 1 was produced in the same manner as Example 1 except that nothing was placed between the copper foil and the press plate, and the same evaluation as made for Example 1 was also conducted.

COMPARATIVE EXAMPLE 2

Comparative Example 2 was produced in the same manner as Example 1 except that the film of Example 1 was changed to an aluminum foil 100 μm in thickness, and the same evaluation as made for Example 1 was also conducted.

COMPARATIVE EXAMPLE 3

Comparative Example 3 was produced in the same manner as Example 1 except for the replacement of the film of Example 1 with polyethylene terephthalate film (melting point of 250° C. and thickness of 37 μm), and the same evaluation as made for Example 1 was also conducted.

COMPARATIVE EXAMPLE 4

Comparative Example 4 was produced in the same manner as Example 1 except for the replacement of the film of Example 1 with triphenylpentene (melting point of 210° C. and thickness of 30 μm), and the same evaluation as made for Example 1 was also conducted.

The results of the evaluation on Examples 1 and 2 and Comparative Examples 1 to 4 are shown in Table 1 below.

TABLE 1

|  | Material for Protection Film | Peeling Property to Copper Foil | Remainder on Copper Foil | Shape of Ruggedness on Copper Foil | Separation Property to Press Plate |
|---|---|---|---|---|---|
| Example 1 | Nylon 6 | o | None | No change | o |
| Example 2 | Nylon 66 | o | None | No change | o |
| Comparative Example 1 | None | o | None | Crush occurred | X |
| Comparative Example 2 | Aluminum foil | o | Present | No change | X |
| Comparative Example 3 | Polyethylene terephthalate | X | Present | No change | o |
| Comparative Example 4 | Triphenylpentene | X | Present | No change | X |

Evaluated on:
1. Peeling property to copper foil:
o: No film adhering to copper foil
X: Film adhered to copper foil
2. Remainder on copper foil:
Observed with an electron microscope (× 2000)
3. Shape of ruggedness on copper foil:
Observed with an electron microscope (× 2000)
4. Separation property to press plate:
o: No film or foil remaining on press plate
X: Film or foil remained on press plate The production method of the present invention to provide a method of producing a copper-clad laminated board for a printed circuit board, which can prevent the film from being stuck on the BSRCF or prepreg, can maintain the ruggedness on that roughened surface of the BSRCF, which is opposite to the surface contacting with the prepreg, and can facilitate production of a CCLBs with both sides roughened for a printed circuit board, which has an excellent separation property with respect of the press plate. This method is therefore suitable for mass production of BSRCFs at a low cost.

What is claimed is:
1. A method for preparing a copper-clad laminated board for a printed circuit board which comprises:
   (a) preparing a prepreg by permeating a thermosetting resin into a fabric and then drying the resulting material to a half-hardened state,
   (b) laminating a both-side roughened copper foil on both sides or one side of the prepreg or plurality of prepegs bonded together, whereby a side of the roughened copper foil is exposed,
   (c) placing the result laminate from step (b) between both press plates of a press machine,
   (d) placing a polyamide film having a melting point equal to or higher than 170° C. between the exposed side of the both-side roughened copper foil of the laminate and a press plate,
   (e) pressing the laminate with the press plates of the press machine at a temperature of 170° C. or higher, a pressure of 10 kgf/cm$^2$ or higher for a time of 60 minutes or longer,
   (f) separating the laminate from the press machine and
   (g) peeling the polyamide film from the laminate to obtain the copper-clad laminated board.
2. The method according to claim 1, wherein the fabric is a nonwoven fabric.
3. The method according to claim 1, wherein the polyamide-type film is selected from the group consisting of a nylon 6 film and a nylon 66 film.
4. The method according to claim 1, wherein the polyamide-type film has a thickness of 10 to 100 μm.
5. The method according to claim 3, wherein the fabric is a nonwoven fabric.
6. The method according to claim 4, wherein the fabric is a nonwoven fabric.
7. The method according to claim 3, wherein the polyamide film has a thickness of 10 to 100 μm.
8. The method according to claim 7, wherein the fabric is a non-woven fabric.
9. The method according to claim 7, wherein the thermosetting resin is selected from the group consisting of a phenolic resin, an epoxy resin, a polyimide resin and a cyanate ester resin.

10. The method according to claim 7, wherein the thermosetting resin is an epoxy modified polyimide resin.

11. The method according to claim 9, wherein the fabric is a fabric of a glass fiber, an aramid fiber, a polyester fiber, a carbon fiber or paper.

12. The method according to claim 1, wherein the thermosetting resin is an epoxy resin, the polyamide-type film is made from nylon 6, the temperature is 170° C. and the time is 180 minutes.

13. The method according to claim 1, wherein the thermosetting resin is an epoxy resin, the polyamide-type film is nylon 66, the temperature is 170° C. and the time is 180 minutes.

* * * * *